(12) United States Patent
Shima

(10) Patent No.: US 8,686,501 B2
(45) Date of Patent: Apr. 1, 2014

(54) SEMICONDUCTOR DEVICE WITH HIGH VOLTAGE TRANSISTOR

(75) Inventor: Masashi Shima, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 546 days.

(21) Appl. No.: 12/893,297

(22) Filed: Sep. 29, 2010

(65) Prior Publication Data

US 2011/0108917 A1    May 12, 2011

(30) Foreign Application Priority Data

Nov. 9, 2009    (JP) ................................ 2009-255820

(51) Int. Cl.
*H01L 29/78* (2006.01)
*H01L 29/36* (2006.01)

(52) U.S. Cl.
USPC .... 257/336; 257/344; 257/345; 257/E29.269; 257/E29.268; 257/E21.417

(58) Field of Classification Search
USPC .......... 257/335, 336, 337, 339, 343, E21.417, 257/E21.427, 345, 344, E29.268, E29.269
See application file for complete search history.

(56) References Cited

U.S. PATENT DOCUMENTS

| | | | |
|---|---|---|---|
| 6,740,932 B2 | 5/2004 | Kikuchi et al. | |
| 6,815,284 B2* | 11/2004 | Uehara et al. | 438/231 |
| 7,045,860 B2 | 5/2006 | Kikuchi et al. | |
| 7,067,878 B2 | 6/2006 | Ohyanagi et al. | |
| 8,269,274 B2* | 9/2012 | Miyagawa et al. | 257/335 |
| 2008/0237703 A1* | 10/2008 | Lin et al. | 257/336 |
| 2008/0283922 A1 | 11/2008 | Yamashita et al. | |
| 2010/0244965 A1* | 9/2010 | Shima et al. | 330/277 |
| 2011/0215403 A1* | 9/2011 | Huang et al. | 257/336 |

FOREIGN PATENT DOCUMENTS

| | | |
|---|---|---|
| JP | 09-223793 A | 8/1997 |
| JP | 10-116983 A | 5/1998 |

(Continued)

OTHER PUBLICATIONS

Hsu, F. C. et al. "Structure-Enhanced MOSFET Degradation Due to Hot-Electron Injection," IEEE Electron Device Letters, Mar. 1984, pp. 71-74, vol. EDL-5, No. 3.

(Continued)

*Primary Examiner* — Calvin Lee
*Assistant Examiner* — Scott Stowe
(74) *Attorney, Agent, or Firm* — Westerman, Hattori, Daniels & Adrian, LLP

(57) ABSTRACT

A semiconductor device includes: a p-type active region; a gate electrode traversing the active region; an n-type LDD region having a first impurity concentration and formed from a drain side region to a region under the gate electrode; a p-type channel region having a second impurity concentration and formed from a source side region to a region under the gate electrode to form an overlap region with the LDD region under the gate electrode, the channel region being shallower than the LDD region; an n-type source region formed outside the gate electrode; and an $n^+$-type drain region having a third impurity concentration higher than the first impurity concentration formed outside and spaced from the gate electrode, wherein an n-type effective impurity concentration of an intermediate region between the gate electrode and the $n^+$-type drain region is higher than an n-type effective impurity concentration of the overlap region.

15 Claims, 7 Drawing Sheets

(56) References Cited

FOREIGN PATENT DOCUMENTS

| | | |
|---|---|---|
| JP | 2002-261276 A | 9/2002 |
| JP | 2002-270825 A | 9/2002 |
| JP | 2003-060199 A | 2/2003 |
| JP | 2004-221223 A | 8/2004 |
| JP | 2008-288366 A | 11/2008 |

OTHER PUBLICATIONS

Japanese Office Action dated Oct. 1, 2013, issued in corresponding Japanese Patent Application No. 2009-255820 with English translation (5 pages).

Non-Final Office Action dated Jun. 21, 2013, issued in U.S. Appl. No. 13/797,084.

* cited by examiner

SEMICONDUCTOR DEVICE WITH HIGH VOLTAGE TRANSISTOR

CROSS-REFERENCE TO RELATED APPLICATION

This application is based on and claims priority of Japanese patent application 2009-255820, filed on Nov. 9, 2009, the entire contents of which are incorporated herein by reference.

BACKGROUND

A) Field

The embodiments discussed herein are related to a semiconductor device including a high voltage transistor and its manufacture method. A transistor having a gate insulating film under a gate electrode is called broadly a MOS transistor.

B) Related Art

In a semiconductor integrated circuit, in addition to a MOS transistor called a core MOS transistor, it becomes necessary in some cases to use another MOS transistor operating at a voltage higher than that of the core MOS transistor. If an input/output voltage of an external circuit is about 3.5 V, an input/output MOS transistor operating at about 3.5 V is required, and in other cases, a MOS transistor operating at a higher operation voltage is required.

In a power amplifier transistor mounted on a transmission module of a wireless portable apparatus, a drain output voltage swings generally a two-fold of a bias voltage or more, in response to an input radio frequency (RF) power. A MOS transistor is therefore required to have a high drain breakdown voltage. A power amplifier mounted on a portable apparatus is generally used in a several hundreds MHz to several GHz band. Excellent high frequency characteristics are therefore desirable at the same time. In high output and high frequency power amplifiers, which are not limited to portable apparatus, high breakdown voltage and excellent high frequency characteristics are often desirable.

For a MOS transistor having high breakdown voltage and excellent high frequency characteristics, it is desired to lower an on-resistance and improve a gain at high frequency. A high breakdown voltage can be obtained by widening a depletion layer between an effective channel region, where current is controlled by a gate voltage, and the drain region connected to a drain electrode. An LDD structure having a region of a lower impurity concentration than that of the drain region (i.e., lightly doped drain (LDD)) formed between the drain region and gate electrode is used widely in MOS transistors.

A structure effective for realizing a high breakdown voltage is an extended drain (ED) MOS transistor structure which widens a depletion layer under the influence of gate voltage, by elongating an overlap length between the LDD region and gate electrode.

It is necessary to secure a threshold voltage and prevent punch-through even in a state of a widened depletion layer. When an impurity concentration in the channel region is increased, it is effective for securing a threshold voltage and preventing punch-through. However, when the channel impurity concentration is increased uniformly, an on-resistance is likely to be raised. Laterally modulated impurity distribution obtained by modulating the lateral distribution of a channel impurity concentration so as to lower the concentration toward the drain makes it possible to secure a threshold voltage in high impurity concentration region and accelerate carriers by built-in field by the impurity concentration gradient. This results in a lowered on-resistance of a MOS transistor and improvement in a high frequency output power. A laterally diffused (LD) channel MOS transistor structure formed by doping channel impurities at a source side region and thermally diffusing the impurities in lateral direction toward the drain side can realize the structure that channel impurities are gradually reduced from the source side to the drain side. In order to diffuse impurities by a long distance, however, it becomes necessary to adopt a high temperature and long time annealing process.

There is difficulty in forming an LDMOS transistor on the same chip as that of a fine MOS transistor of the 90 nm generation and following generations. In addition, a source side resistance is likely to become high if a channel impurity concentration is increased at the source side.

F.-C. HSU et al.: IEEE ED EDL 5, No. 3, pp. 71-74 (1984) reports that in a MOSFET of a novel structure including a minimum overlap gate, an offset gate, a concentration gradient drain, an LDD structure and the like, interface charges induced by hot carrier injection in a low sheet-charge density region outside the gate edge causes an external channel pinch-off so that a transconductance is likely to lower (degrade) considerably, and describes that since degradation is very sensitive to a sheet-charge density outside the gate edge, an overlap should be provided between the gate electrode and the source/drain region.

Japanese Patent Laid-open Publication No. 10-116983 indicates that since a p-type well for a medium or middle voltage MOS transistor has a high concentration for the purpose of a short channel, this MOS transistor is not suitable for a high voltage MOS transistor whose p-type well has preferably a low concentration for high breakdown voltage, and proposes that n-type impurity ions As are implanted into a region near the drain, by using resist mask, and p-type impurity ions B are implanted broadly in the active region in an n-type silicon substrate, and the impurity ions are diffused at the same time by thermal diffusion of, e.g., at 1200° C., for 8 hours to form a very low concentration $p^-$-type diffusion layer in a p-type well lowering its effective impurity concentration through compensation by n-type impurities, and that n-type impurity ions, e.g., P ions, are implanted into the $p^-$-type diffusion layer and diffused by thermal diffusion of 1200° C. and 2 hours to form an $n^-$-type drain (LDD) diffusion layer. Thereafter, a gate electrode is formed overlapping the $n^-$-type drain diffusion layer, and an $n^+$-type drain region is formed spaced apart from the gate electrode.

Japanese Patent Laid-open Publication No. 2002-261276 indicates that when avalanche multiplication occurs in an NMOS transistor having an n-type drain with an LDD region formed in a p-type substrate, a substrate potential may rise because of inflow of positive charges, forming a parasitic bipolar transistor, and positive feed-back may occur, and proposes that a gate electrode is formed overlapping the LDD region, a high concentration drain region is formed being separated from the edge of the gate electrode on the drain side, and a middle concentration drain region is formed extending from a neighborhood of the gate electrode to the high concentration drain region, the impurity concentration lowering from the gate electrode side toward the high concentration drain region. The middle concentration drain region formed by ion implantation at a high acceleration energy, has an impurity concentration peak at a predetermined depth, and lowers its impurity concentration toward the surface.

SUMMARY OF THE INVENTION

An object of the present invention is to provide a semiconductor device capable of realizing a high breakdown voltage and having excellent characteristics, and its manufacture method.

According to one aspect of the present invention, a semiconductor device includes:

a semiconductor substrate;

an isolation region formed in the semiconductor substrate, the isolation region defining a first active region;

a first well of a first conductivity type formed in the first active region;

a first gate electrode formed above the first well;

a first drain region formed from a location outside one edge of the first gate electrode to a location under the first gate electrode as viewed in plan in the first well, the first drain region having a first impurity concentration of a second conductivity type opposite to the first conductivity type;

a first channel region formed from a location outside the other edge of the first gate electrode to a location under the first gate electrode as viewed in plan in the first well, forming an overlap region which overlaps a portion of the first drain region under the first gate electrode, the first channel region having a second impurity concentration of the first conductivity type;

a source region of the second conductivity type formed outside the other edge of the first gate electrode as viewed in plan in the first well; and a second drain region of the second conductivity type formed outside of the one edge of the first gate electrode and spaced apart from the first gate electrode as viewed in plan in the first well, the second drain region having a third impurity concentration higher than the first impurity concentration, wherein a second conductivity type effective impurity concentration of an intermediate region between the one edge of the first gate electrode and the second drain region, in the first drain region, is higher than a second conductivity type effective impurity concentration of the overlap region.

According to another aspect of the present invention, a method for manufacturing a semiconductor device comprises the steps of:

forming an isolation region in a semiconductor substrate, the isolation region defining first, second and third active regions;

implanting first impurity ions of a first conductivity type into the first, second and third active region to form first, second and third wells, respectively;

masking the third active region and a portion of the first active region, and implanting second impurity ions of the first conductivity type into the first and second active regions to form first and second channel regions, respectively;

implanting second impurity ions of a second conductivity opposite to the first conductivity type into the first active region to form a first drain region, in such a manner that a portion of the first channel region is overlapped with the first drain region;

forming first, second and third gate electrodes above the first, second and third active regions, respectively, the first gate electrode superposing a portion of the first drain region and covering one lateral end of the first channel region;

forming first insulating side wall spacers on side walls of the second and third gate electrodes above the second and third active regions, respectively, and forming a second insulating side wall spacer on a side wall of the first gate electrode on a source side, and forming an insulating film extending from above a drain-side region of the first gate electrode to a location above the first drain region; and implanting fourth impurity ions of the second conductivity type into the first, second and third active regions to form second drain/source regions.

A high breakdown voltage and excellent characteristics can be realized.

DESCRIPTION OF THE PREFERRED EMBODIMENTS

A process of forming an LD channel dose region by a high temperature and long time diffusion process is hard to be applied to an advanced CMOS process. In an ordinary CMOS process, a threshold voltage adjusting channel dose region is formed by uniform ion implantation into a whole surface layer of the active region.

Figure 6A:
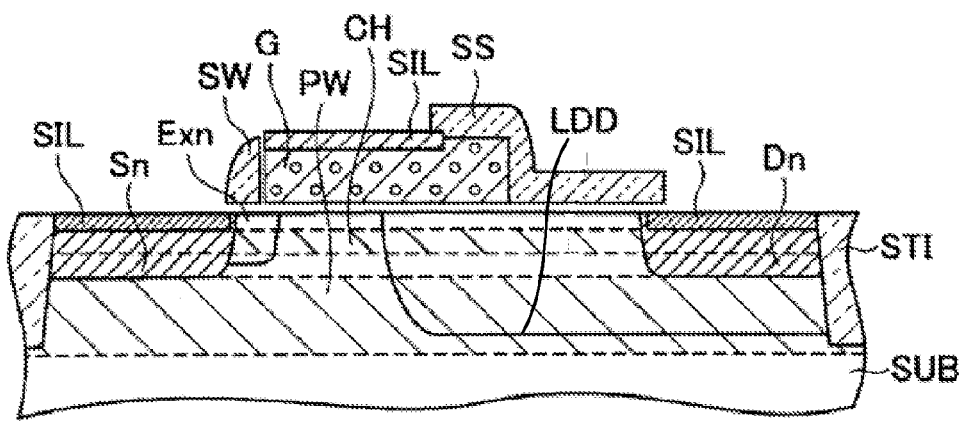
FIGS. 6A and 6B are a cross sectional view of a semiconductor substrate illustrating a semiconductor device formed for preliminary experiments, and a graph indicating the experiment results of characteristics of the semiconductor device.

FIG. 6A is a cross sectional view illustrating the structure of an NMOS high breakdown voltage transistor with channel dose in a whole surface layer of the active region, as a test product for preliminary experiments. An isolation groove (shallow trench) was etched in a silicon substrate SUB, and the groove was filled with an insulating film of silicon oxide or the like to form a shallow trench isolation region STI. P-type impurity ions for forming a p-type well PW and p-type impurity ions for forming a p-type channel dose region CH were implanted in the whole surface layer of the active region defined by the isolation region STI. N-type impurity ions were implanted through a resist mask exposing a lightly doped region (LDD), to form an n-type lightly doped drain region LDD.

A gate oxide film having a thickness of about 7 nm was formed on the surface of the active region, and a polysilicon film having a thickness of about 100 nm was deposited on the gate oxide film. By using a resist mask of a gate electrode shape as an etching mask, the polysilicon film was etched to pattern a gate electrode G overlapping the lightly doped drain region LDD. N-type impurity ions were implanted into the source side, covering the drain side with a resist mask, to form an n-type extension region EXn. An insulating lamination layer of an oxide film and a nitride film was deposited. A resist mask extending from a portion the gate electrode on the drain side to the drain region by a predetermined length was formed on the insulating lamination layer, and the insulating lamination layer was anisotropically etched to leave a side wall spacer SW on the source side and an insulating film SS on the drain side. The insulating film SS functions as a silicide stopper during a silicidation process. N-type impurity ions were implanted at a high concentration into the regions outside the side wall spacer SW and silicide stopper SS to form a high concentration source region Sn and a high concentration drain region Dn. Thereafter, a silicide layer SIL was formed on each of the exposed silicon surfaces.

In the region where the p-type channel dose region CH and the n-type low concentration drain region LDD are superposed, the n-type impurities are compensated by the p-type impurities so that an effective impurity concentration of the n-type impurities lowers. This low effective impurity concentration is effective for broadening a depletion layer under the gate electrode G and realizing a high breakdown voltage. The insulating film SS is an element necessary for spacing the high concentration drain region Dn from the gate electrode G. A region having a low effective impurity concentration is left under the insulating film SS. This layout can be said as a structure that hot electrons are likely to be injected to an insulating film laterally adjacent to the gate, reported by HSU at IEEE ED EDL 5, p. 71.

Figure 6B:
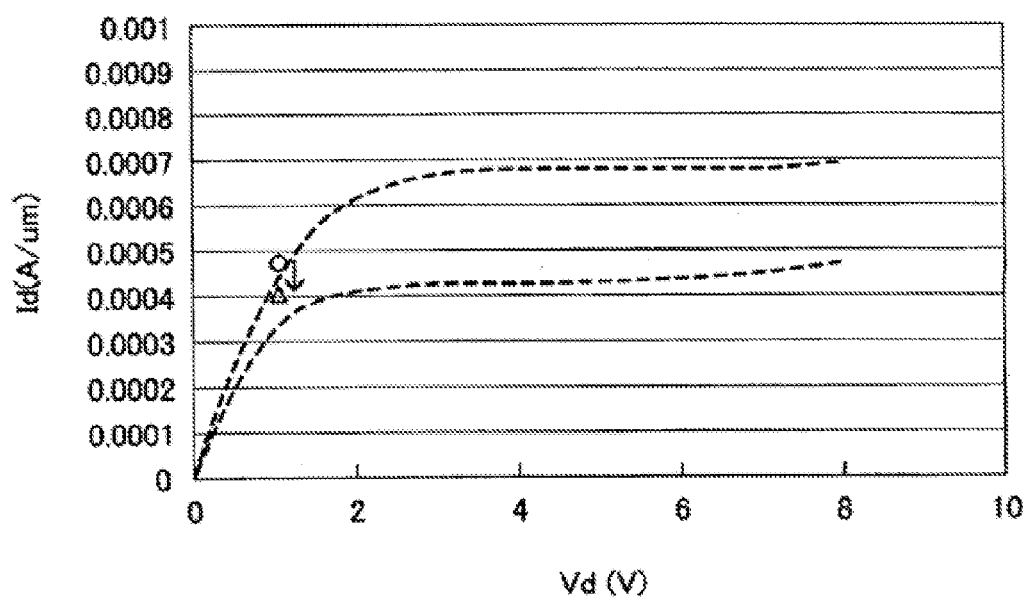

FIG. 6B illustrates I-V characteristics of a test product of an NMOS transistor. The abscissa represents a drain voltage Vd in the unit of V, and the ordinate represents a drain current Id in the unit of A/μm. A measured value immediately after voltages are applied to the source, gate and drain is indicated by a hollow circle, and a measured value after an immediate change in the characteristics is indicated by a hollow triangle. For reference, examples of the I-V characteristics are indicated by broken lines. It can be seen that the characteristics are degraded by 10% or more soon after the voltages are initially applied. This degradation is called initial degradation. The initial degradation means that an on-resistance increases instantly when a high voltage is applied to the drain, and the characteristics are degraded.

It is considered that hot carriers are generated in the low impurity concentration region outside the gate electrode, interface energy levels are formed on the insulating film in a region laterally adjacent to the gate electrode, and a parasitic resistance on the drain side increases to form the initial degradation. It is considered that as hot carriers are generated, interface energy levels are formed on the insulating film in a region laterally adjacent to the gate to trap free carriers and accumulate charges. It is considered that because of these influences, an on-resistance increases and an on-current lowers.

The present inventor considers that in order to suppress the initial degradation, it is required to remove a low impurity concentration region near a substrate surface outside the gate electrode. One method of preventing an effective impurity concentration of an n-type impurity from being lowered by compensation of n- and p-type impurities is to remove p-type impurities of the channel dose (n-type impurities in the case of PMOS).

Figure 1A:
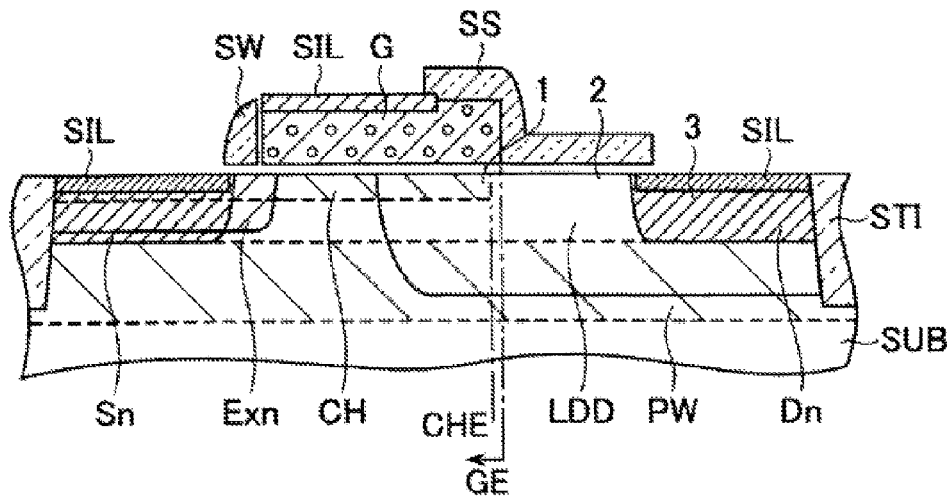
FIGS. 1A and 1B are cross sectional views of a semiconductor substrate illustrating the structure of a semiconductor device according to a first embodiment, and examples of its main parameters.

FIG. 1A is a cross sectional view of a semiconductor substrate schematically illustrating the structure of an NMOS transistor according to the first embodiment. An isolation region of a shallow trench isolation type STI is formed to define active regions in a silicon substrate SUB. A p-type well PW is formed in an active region by doping p-type impurities. With respect to the drain side edge of the gate electrode G, which is to be formed by a later process, only in a region on the source side a channel dose region CH shallowly doped with p-type impurities is formed. An n-type first drain region LDD doped with n-type impurities is formed from the drain side, extending toward the source side under the gate electrode to be formed after, i.e. overlapping the gate electrode in the plan view. A silicon oxide film having a thickness of about 7 nm is formed in a surface of the active region, and a polysilicon film having a thickness of about 100 nm is deposited on the silicon oxide film. A gate electrode G is patterned from the polysilicon film, through etching using a gate electrode shaped resist mask.

The previously formed channel dose region CH has a lateral edge or channel end CHE, disposed on the source side with respect to the drain side edge GE of the gate electrode. The channel dose region CHE does not exist outside the drain side gate edge GE of the gate electrode G. A side wall spacer SW is formed on the side wall of the gate electrode G on the source side, and an insulating film SS is formed on and extending from a drain side portion of the gate electrode G to the n-type first drain region LDD. Thus, the surface of such portion of the first drain region LDD that is adjacent to the gate electrode and has a predetermined width is covered with the insulating film SS. An n-type source region Sn and an n-type second drain region Dn are formed outside the side wall spacer SW and insulating film SS, respectively. An impurity concentration of the n-type second drain region Dn is higher than an impurity concentration of the n-type first drain region LDD. Silicide layers SIL are formed on the exposed silicon surfaces.

In the neighborhood of the surface of the first drain region LDD, are formed a region 1 overlapping the channel dose region CH and having a lowered effective impurity concentration, a region 3 having a high impurity concentration and serving as a second drain region outside the insulating film SS, and a region 2 between the regions 1 and 3. For example, an n-type impurity concentration of the region 1 is 5E16 to 1E17 cm$^{-3}$, an n-type impurity concentration of the region 2 is 2E17 to 5E18 cm$^{-3}$, and an n-type impurity concentration of the region 3 is 1E19 to 1E20 cm$^{-3}$. Here, the notation xEy means x x $10^y$. For example, 3E13 means $3\times10^{13}$. According to the review of the present inventor, it has been found that an n-type impurity concentration of the region 2 between the gate electrode and the highly doped drain region is preferably 2E17 cm$^{-3}$ or higher in order to suppress the initial degradation. For high voltage operation, the impurity concentration just outside the gate is preferably not too high. Thus, the impurity concentration of the region between the gate electrode and the heavily doped drain region is preferably from 2E17 cm$^{-3}$ to 5E18 cm$^{-3}$.

Figure 1B:
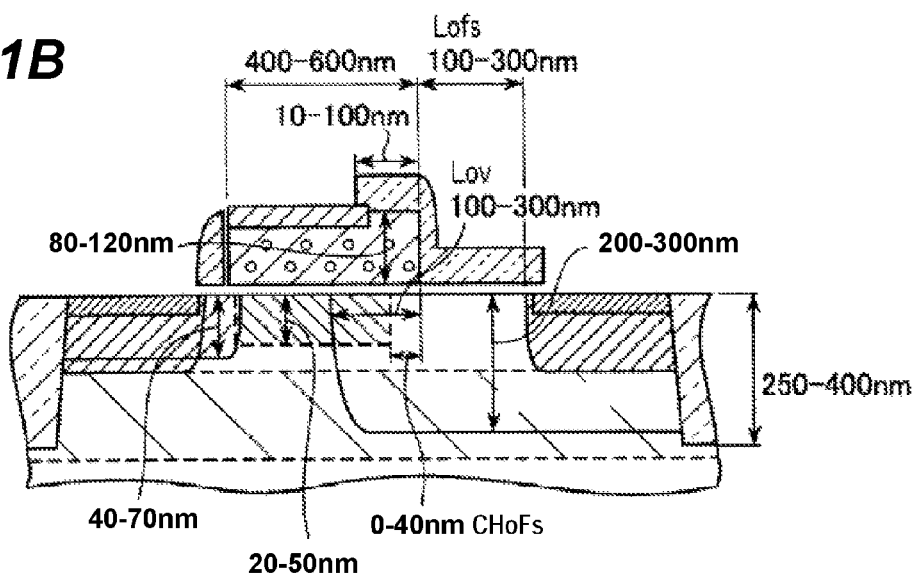
Figure 1C:
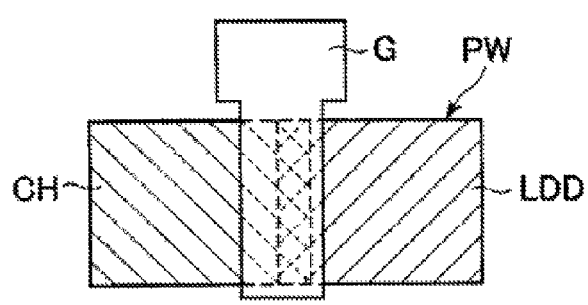
FIG. 1C is a schematic plan view illustrating a relation between a gate electrode, a channel dose region and a low concentration drain region.

As illustrated in FIG. 1C, the gate electrode G is formed traversing the active region made of the p-type well PW. The channel dose region CH is formed from the source region at the left in the drawing sheet, going into a region under the gate electrode G, and the first drain region LDD is formed from the drain region at the right in the drawing sheet, going into a region under the gate electrode by a predetermined distance (overlap length). The channel dose region CH and first drain region LDD overlap under the gate electrode to form an overlap region (cross-hatched region) having an effective impurity concentration lowered by compensation of the n-type and p-type impurities.

Reverting to FIG. 1A, a side wall spacer SW is formed on the side wall of the gate electrode G on the source side, and an insulating film SS is formed covering an area from a portion of the gate electrode G on the drain side, on the side wall of the gate electrode on the drain side, and extending on the drain region by a predetermined length, e.g., about 100 nm to 300 nm. Both of the side wall spacer SW and the insulating film SS are formed of an insulating lamination layer made of a silicon oxide film having a thickness of about 10 nm and a silicon nitride film having a thickness of about 30 nm. An n-type source region Sn heavily doped with n-type impurities is formed outside the side wall spacer SW. A second n-type drain region Dn heavily doped with n-type impurities is formed outside the insulating film SS. Silicide layers SIL are formed on the exposed silicon surfaces.

FIGS. 2A to 2K are cross sectional views of a semiconductor substrate schematically illustrating manufacture processes for a semiconductor integrated circuit device. The semiconductor integrated circuit device includes: the NMOS transistor illustrated in FIG. 1A; a core transistor formed, e.g., in a circuit core portion and operating at a lower voltage than the NMOS transistor in FIG. 1A; and an input/output transistor formed, e.g., in an input/output circuit and operating at an I/O voltage lower than the voltage of the NMOS transistor in FIG. 1A and higher than the voltage of the core transistor. Although the core transistor and input/output transistor include not only NMOS but also PMOS, this embodiment will be described by using NMOS transistors by way of example. For the PMOS transistor, the conductivity type of impurities is reversed. In the drawing sheets, the NMOS core transistor is drawn at the left, the NMOS transistor (hereinafter called a first transistor) of FIG. 1A is drawn at the right, and an NMOS input/output transistor is drawn at the middle.

Figure 2A:
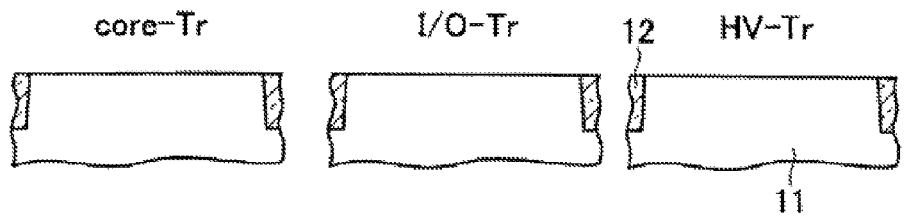
FIGS. 2A to 2K are cross sectional views of a semiconductor substrate illustrating main processes of a method for manufacturing an integrated circuit device including the semiconductor device according to the first embodiment.

As illustrated in FIG. 2A, a trench having a depth of about 250 nm to 400 nm is etched in the surface layer of a silicon substrate 11, and filled with an insulating film such as a silicon oxide film. An unnecessary portion of the insulating film is removed by chemical mechanical polishing (CMP) or the like to form an STI type isolation region 12.

Figure 2B:
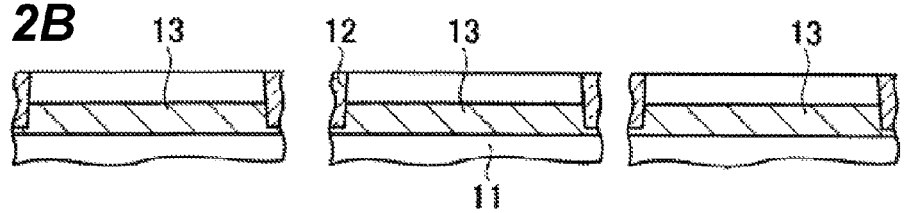

As illustrated in FIG. 2B, p-type impurity ions are implanted to form respective p-type wells 13. For example, B ions are implanted at an acceleration energy of 100 keV to 200 keV and a dose of $2\times10^{13}$ to $5\times10^{13}$ cm$^{-2}$. Thus, the wells 13 have a same depth and a same impurity concentration.

Figure 2C:
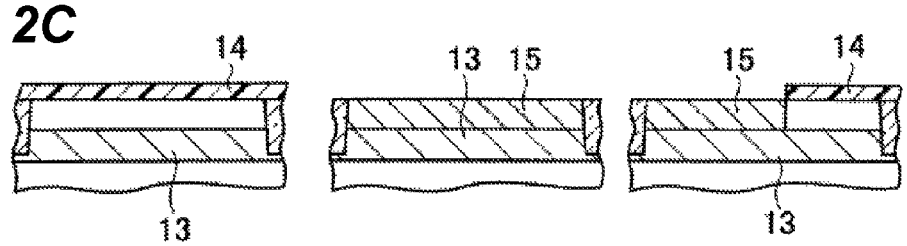

As illustrated in FIG. 2C, a resist mask 14 is formed covering the whole core transistor active region and a portion of the first transistor active region and exposing the input/output transistor active region and a selected area of the first transistor active region, and p-type impurity ions, e.g., B ions, are implanted at an acceleration energy of 30 keV to 40 keV and a dose of 3E12 cm$^{-2}$ to 6E12 cm$^{-2}$ to form respective channel dose regions 15. Thus, the channel dose region 15 of the input/output transistor and the channel dose region of the first transistor have a same depth and a same impurity concentration. The resist mask 14 is thereafter removed.

Although the resist mask is used for selective ion implantation into the first transistor region, if a resist mask covering the core transistor or a resist mask covering PMOS transistors of a CMOS circuit are used, the number of masks does not increase.

Figure 2D:
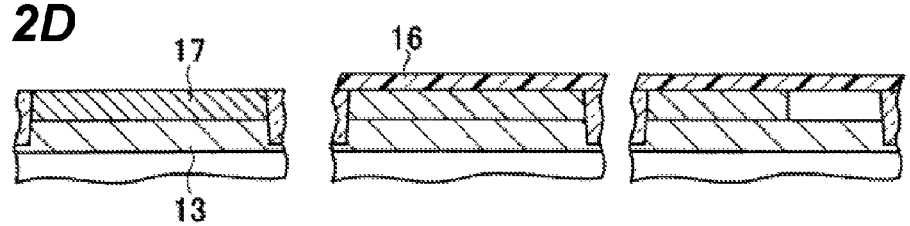

As illustrated in FIG. 2D, by covering the input/output transistor region and the first transistor region with a resist mask 16, ion implantation for channel dose is performed for a core transistor region. For example, p-type impurity ions B are implanted at an acceleration energy of 15 keV to 25 keV and a dose of 1E13 cm$^{-2}$ to 3E13 cm$^{-2}$ to form a channel dose region 17. Thus, the channel dose region of the core transistor has a higher impurity concentration than those of the input/output transistor. The resist mask 16 is thereafter removed.

Figure 2E:
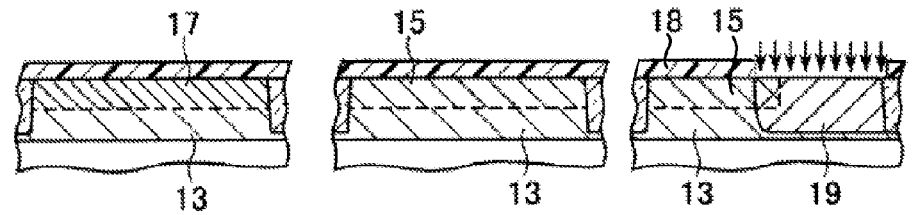

As illustrated in FIG. 2E, a resist mask 18 is formed having an opening in an area where a first drain (LDD) region of the first transistor is to be formed, and n-type impurity ions, e.g., P ions, are implanted for example at an acceleration energy of 50 keV to 200 keV and a dose of 1E13 cm$^{-2}$ to 3E13 cm$^{-2}$ to form an LDD region 19. The resist mask 18 is thereafter removed. Annealing is performed for example at 1000° C. for 10 sec to activate impurity ions implanted up to this time. The LDD region 19 is deeper than the channel dose region 15, and partially overlaps with the channel dose region 15 of the first transistor.

Figure 2F:
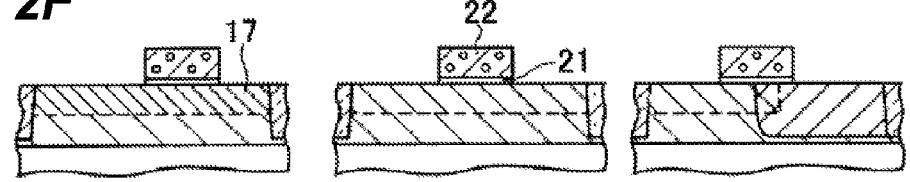

As illustrated in FIG. 2F, the surfaces of the active regions are thermally oxidized to form respective silicon oxide films having a thickness of about 7 nm. The silicon oxide film in the core transistor region is etched and removed, and another thin silicon oxide film having a thickness of 1.2 nm to 2.0 nm is formed on the active region of the core transistor. By using the silicon films formed in this manner, gate insulating films 21 are formed. A polysilicon film having a thickness of, e.g., 100 nm is formed on the silicon oxide films. A resist mask having respective gate electrode shapes is formed on the polysilicon film, and the polysilicon film is etched to pattern gate electrodes 22.

The (drain-side) lateral end of the channel dose region 15 of the first transistor is set as being covered with the gate electrode. When considering a position alignment error, the gate electrode is patterned in such a manner that the side wall of the gate electrode on the drain side is set outside the drain side lateral end of the channel dose region by an amount equal to or longer than the position alignment error margin. More positively, the drain side lateral end of the channel dose region 15 may be spaced apart from the drain side edge of the gate electrode, remote from the drain region.

Figure 2G:
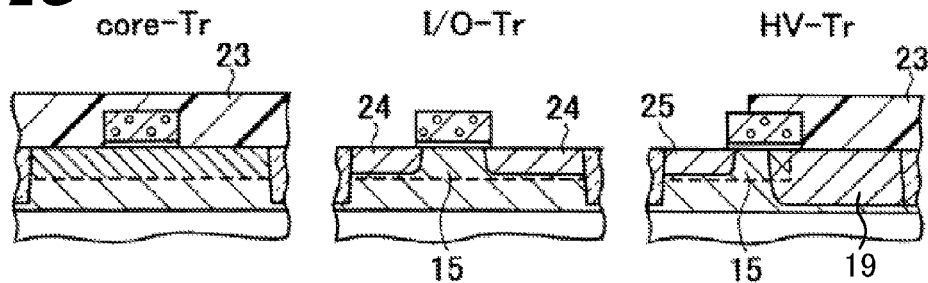

As illustrated in FIG. 2G, a resist mask 23 is formed covering the whole core transistor region and the drain region (and part of the gate electrode) of the first transistor, and n-type impurity ions P are implanted into the source side of the first transistor and the source and drain sides of the input/output transistor outside the gate electrodes, under the condition that a peak position is shallower than the channel dose region 15 and under the condition that P dose is larger than B dose and a portion implanted in a superposed manner becomes an n-type, to thereby form n-type extension regions 24 and 25. For example, P ions are implanted at an acceleration energy of 30 keV and a dose of 3E13 cm$^{-2}$. Since the mask covering the drain side of the first transistor is used in common with the mask covering the core transistor, the number of masks does not increase.

Figure 2H:
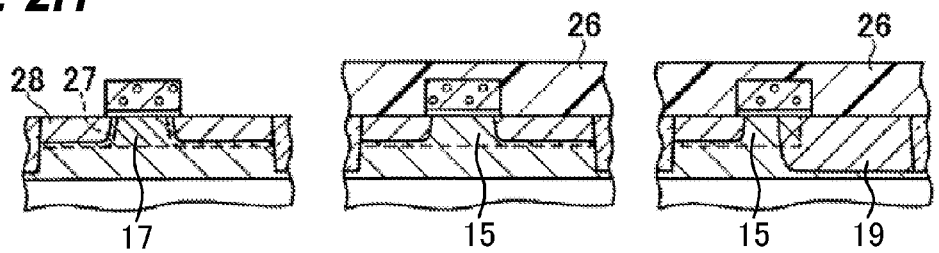

As illustrated in FIG. 2H, a resist mask 26 is formed covering the input/output transistor and the first transistor, p-type impurity ions are implanted obliquely (relative to the substrate surface) to form p-type pocket regions 27, and n-type impurity ions are implanted vertically (relative to the substrate surface) to form n-type extension regions 28 in the core transistor region. For example, p-type impurity ions B are implanted obliquely at an implantation angle of 25 degrees to 45 degrees from the substrate normal at an acceleration energy of 5 keV to 10 keV and a dose of 1E13 cm$^{-2}$ to 5E13 cm$^{-2}$, and n-type impurity ions P are implanted approximately vertically at an implantation angle of 0 to 7 degrees from the substrate normal at an acceleration energy of 1 keV to 5 keV and a dose of 1E15 cm$^{-2}$ to 5E15 cm$^{-2}$. All other ion implantations are performed approximately vertically (0 to 7 degrees from the substrate normal). The resist mask 26 is removed thereafter. The pocket region 27 has the same conductivity type as the channel dose region 17, and the pocket region is omitted from the drawing sheet in the following.

Figure 2I:
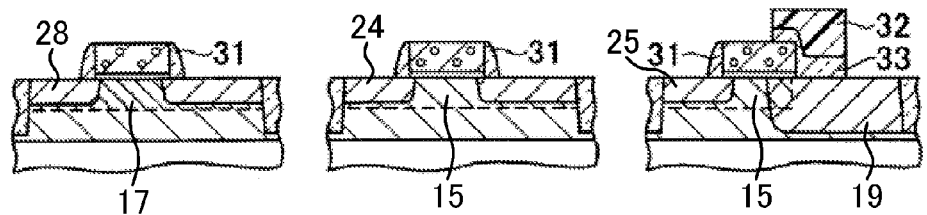

As illustrated in FIG. 2I, an insulating lamination layer is formed by depositing a silicon oxide film having a thickness of about 10 nm and a silicon nitride film having a thickness of about 30 nm on the whole substrate surface. A resist mask 32 is formed on the insulating lamination layer, extending from a region above the drain side region of the gate electrode to a region above the drain region of the first transistor, by a predetermined length, e.g., about 200 nm, and the insulating lamination layer is anisotropically etched. An insulating film 33 is therefore formed covering the drain region by a length of about 200 nm from the gate electrode to the drain side in the first transistor. Side wall spacers 31 are formed on other side walls of the gate electrodes, i.e. on the both sides of the gate electrodes of the core transistor and the input/output transistor, and on the source side side wall of the gate electrode of the first transistor.

Figure 2J:
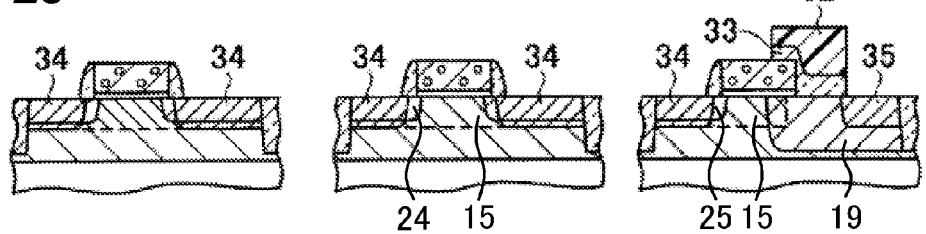

As illustrated in FIG. 2J, in order to form heavily doped n-type source/drain regions, n-type impurity ions, e.g., P ions, are implanted at an acceleration energy of 10 keV and a dose of $5E15$ cm$^{-2}$ to form source/drain regions 34 and an off-set drain region 35 offset from the gate electrode. The off-set drain region 35 corresponds to the second drain region Dn in FIG. 1A. The resist mask 32 is thereafter removed. Annealing is performed for example at 1000° C. and for 1 sec to activate implanted impurity ions.

Figure 2K:
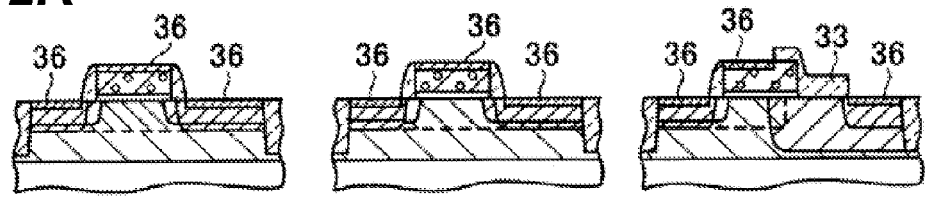

As illustrated in FIG. 2K, a cobalt film or a nickel film is deposited on the whole substrate surface, covering the exposed silicon surfaces, and silicidation is caused to form silicide layers 36. An unreacted metal film is washed out. Although numerical values are used in the above description, these numerical values are only illustrative and not limitative.

FIG. 1B is a schematic cross sectional view of the first NMOS transistor formed in this manner, illustrating parameters of the structure. An STI depth of the isolation region is 250 nm to 400 nm, an LDD depth is 200 nm to 300 nm, an overlap length Lov between the LDD region and the gate electrode is 100 nm to 300 nm, and a depth of the channel dose region, in which channel impurities are distributed, is 20 nm to 50 nm. An offset length CHofs of the drain side lateral end of the channel dose region retracted from the drain side edge of the gate electrode is, for example, 0 nm to 40 nm (when the lateral end of the channel dose region and the edge of the gate electrode are to be aligned). The lateral end of the channel dose region and the edge of the gate electrode may be spaced wider. An extension depth is 40 nm to 70 nm, a polysilicon height of the gate electrode is 80 nm to 120 nm, and a polysilicon gate length is 400 nm to 600 nm. An offset length Lofs of the drain region offset from the gate electrode is 100 nm to 300 nm, and a length of the insulating film extending above the gate electrode is 10 nm to 100 nm. The LDD region and channel dose region are overlapped under the gate electrode to form the region 1 having a lowered impurity concentration. The region 3 is formed of the heavily doped drain region spaced by the offset length Lofs from the gate electrode toward the drain region. The region 2 having a length of Lofs+CHofs is formed between the regions 1 and 3, having an impurity concentration of an intermediate value of the regions 1 and 3.

Figure 3A:
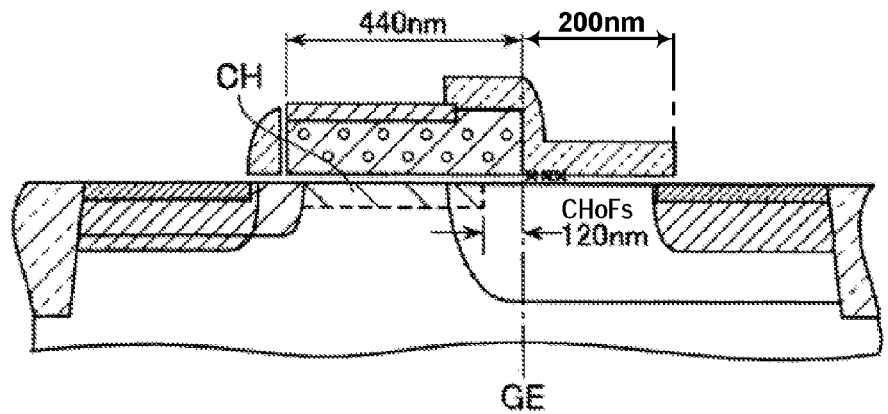
FIGS. 3A, 3B and 3C are cross sectional views of a test product and a comparative example, and a graph illustrating measured data by experiments.

FIG. 3A is a schematic cross sectional view illustrating the structure of a test sample manufactured in accordance with the first embodiment. A gate length is 440 nm. The channel dose region CH was offset from the drain side gate edge GE of the gate electrode by 120 nm (CHoFs=120 nm). The insulating film of a lamination of a silicon oxide film and a silicon nitride film or the like covers the region from the side wall of the gate electrode to the drain region by 200 nm. The region 2 was formed by 120 nm+200 nm=320 nm between the region 1 under the gate electrode and the region 3 on the drain side.

Figure 3B:
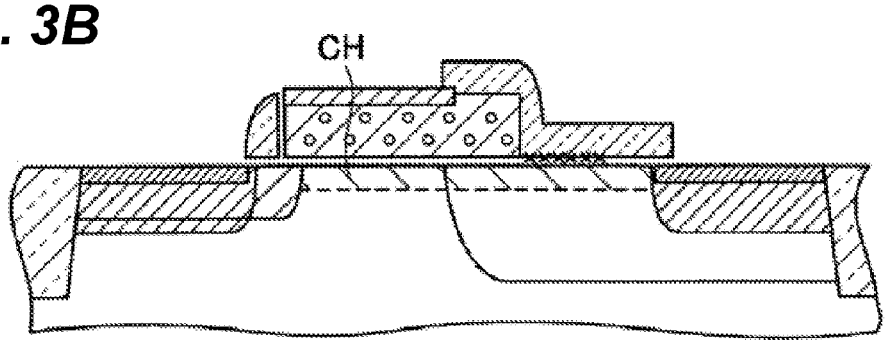

FIG. 3B is a cross sectional view illustrating the structure of a comparison example whose channel dose is performed for the whole surface layer of the active region. The region 2 does not exist, and the whole LDD region from the region 3 toward the source side constitutes the region 1.

Figure 3C:
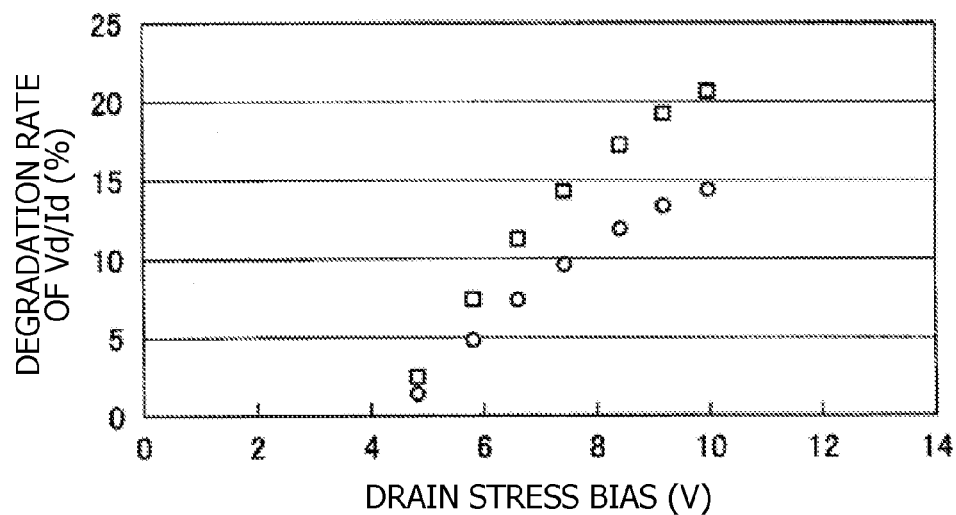

FIG. 3C is a graph illustrating the characteristics of both the test sample and the comparative example. The abscissa represents a drain stress bias in the unit of V, and the ordinate represents a degradation rate of an on-resistance (Vd/Id) in the unit of %. A gate voltage was 3.3 V. The initial degradation occurs at a drain stress bias of about 5 V or higher. As the degradation rate lowers, the characteristics become excellent. Measured values of the test sample are indicated by hollow circles, and measured values of the comparative example are indicated by hollow squares. A degradation rate of the test sample is, as a whole, definitely lower than a degradation rate of the comparative example. For example, at a drain stress bias of 6.6 V, the degradation rate of the comparative example is higher than 11%, whereas that of the test sample is lower than 8%, realizing considerable degradation suppression.

In the first embodiment, compensation of impurities outside the gate electrode is avoided by not forming the channel dose region outside the gate electrode on the drain side. An impurity concentration may be positively added. In the second embodiment, the extension region is formed also on the drain side to increase an impurity concentration outside the gate electrode on the drain side.

Figure 4A:
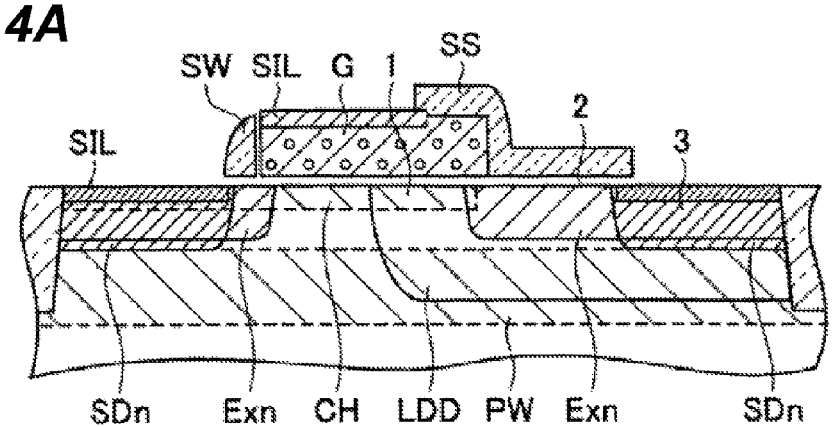
FIG. 4A is a cross sectional view of a semiconductor substrate illustrating the structure of a semiconductor device according to a second embodiment.

FIG. 4A illustrates the structure of a semiconductor device according to the second embodiment. Different points from the first embodiment will be described mainly. After the gate electrode G is patterned, n-type impurity ions are implanted into the source and drain sides by using the gate electrode G as a mask to form extension regions Exn on the source and drain sides. Other structures are the same as those of the first embodiment.

Figure 4B:
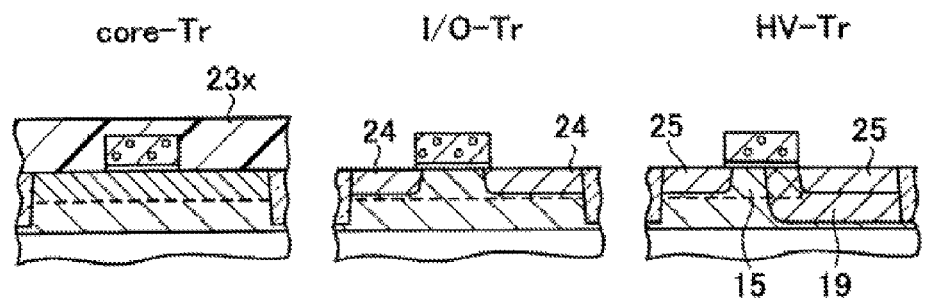
FIGS. 4B to 4D are cross sectional views of the semiconductor substrate illustrating main processes of a method for manufacturing an integrated circuit device including the semiconductor device according to the second embodiment.
Figure 4C:
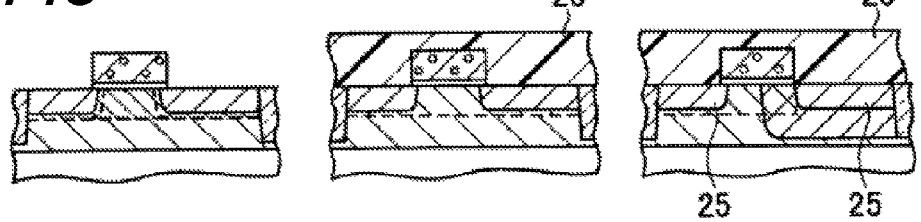
Figure 4D:
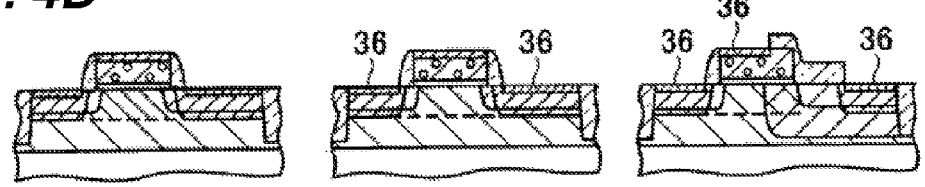

FIGS. 4B to 4D are cross sectional views of a semiconductor substrate illustrating main processes of a method for manufacturing an integrated circuit device including a semiconductor device according to the second embodiment. First, similar to the first embodiment, processes illustrated in FIGS. 2A to 2F are performed. The gate electrodes are formed for the core transistor, input/output transistor and first transistor.

As illustrated in FIG. 4B, the core transistor is covered with a resist mask 23x, and n-type impurity ions, e.g., P ions, are implanted at an acceleration energy of 30 keV and a dose of $1E13$ cm$^{-2}$ to form extension regions 24 on the source and drain sides of the input/output transistor and also extension regions 25 on the source and drain sides of the first transistor. The extension regions 24 and 25 are formed by a same process, and hence do not need any additional process. In the first transistor, the region outside the drain side edge of the gate electrode, the LDD region 19 and the extension region 25 are superposed to have an increased impurity concentration. This process corresponds to the process illustrated in FIG. 2G, and is different in that the resist mask 23x is not formed on the first transistor.

As illustrated in FIG. 4C, the input/output transistor and first transistor are covered with a resist mask 26, and impurity ions for forming pocket regions and extension regions of the core transistors are implanted. This process is similar to the process illustrated in FIG. 2H. Thereafter, processes similar to those illustrated in FIGS. 2I and 2J are executed. Annealing is performed to activate implanted impurity ions.

As illustrated in FIG. 4D, a silicide layer 36 is formed on exposed silicon surfaces. This process is similar to the process illustrated in FIG. 2K.

According to the second embodiment, the extension region is also formed outside the gate electrode on the drain side in the first transistor so that an impurity concentration outside the gate electrode on the drain side increases. Hot electrons are suppressed outside the gate electrode.

In the first and second embodiments, channel dose is not performed outside the gate electrode on the drain side, a lowered effective impurity concentration to be caused by compensation of impurity concentrations is avoided by omitting channel dose outside the gate electrode on the drain side. It is also possible to perform the channel dose of the first transistor in the whole surface layer of the active region.

Figure 5A:
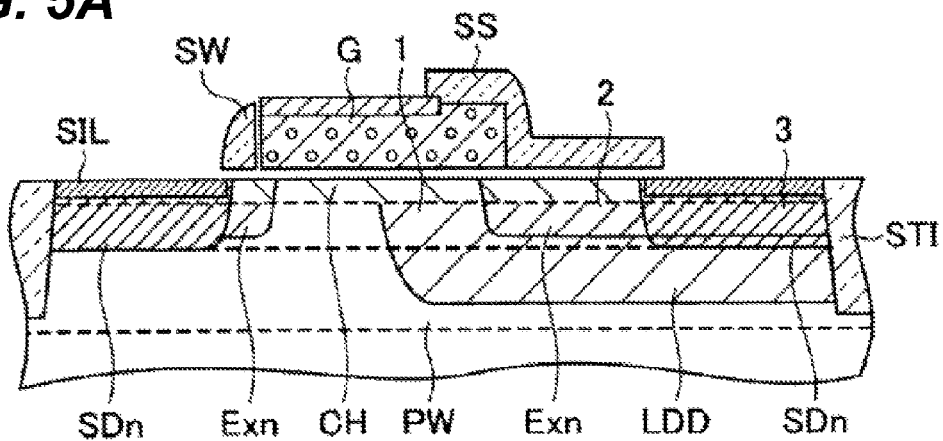
FIG. 5A is a cross sectional view of a semiconductor substrate illustrating the structure of a semiconductor device according to a third embodiment.

FIG. 5A is a cross sectional view illustrating the structure of a semiconductor device according to the third embodiment. Different points from the second embodiment will be described mainly. A channel dose region CH is formed in the whole surface layer of the active region. A first drain region LDD, extension regions EXn and second source/drain regions SDn are formed partially overlapping the channel dose region CH. Similar to the embodiments described above, the region where the channel dose region CH and first drain region LDD overlap, has a lowered impurity concentration because of compensation of impurity ions. The region where the channel dose region CH, and the first drain region LDD and extension region EXn overlap, has a lower impurity concentration than that of the second embodiment. Since an impurity concentration for forming the extension region is generally higher than an impurity concentration of the channel dose, an impurity concentration of the region 2 outside the gate electrode G on the drain side under the insulating film SS is higher than that of the region 2 of the first embodiment illustrated in FIG. 1A.

According to the study of the present inventor, it has been found that in order to suppress the initial degradation by hot electrons, it is desired that an impurity concentration near the surface layer (of a depth of 30 nm or shallower from the surface) outside the gate electrode on the drain side is in a range of $2E17 \text{ cm}^{-3}$ to $5E18 \text{ cm}^{-3}$. It is therefore desired that ion implantation for the extension region is performed at an acceleration energy of 30 keV or lower, e.g., about 20 keV or lower when the impurity is P.

Figure 5B:
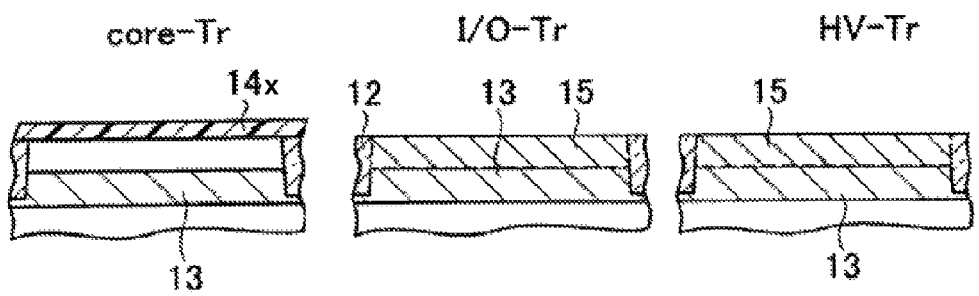
FIGS. 5B to 5D are cross sectional views of the semiconductor substrate illustrating main processes of a manufacture method for an integrated circuit device including the semiconductor device according to the third embodiment.
Figure 5C:
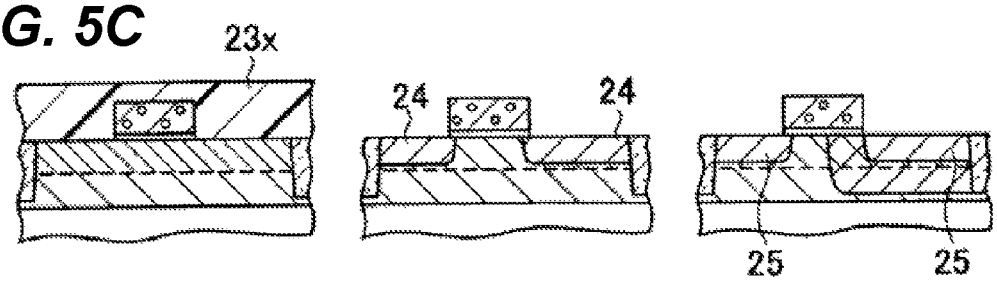
Figure 5D:
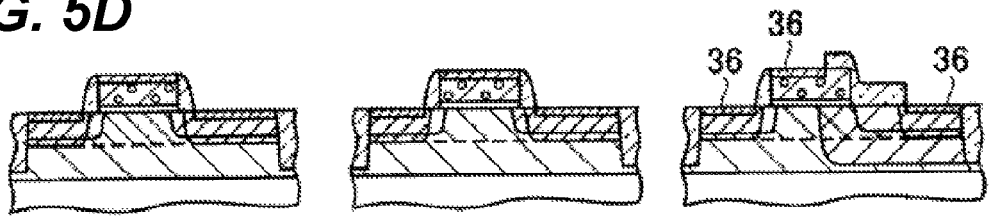

FIGS. 5B to 5D are cross sectional views of a semiconductor substrate illustrating main processes of a method for manufacturing an integrated circuit device including a semiconductor device according to the third embodiment. First, similar to the first embodiment, processes illustrated in FIGS. 2A and 2B are performed.

As illustrated in FIG. 5B, the core transistor is covered with a resist mask 14x, and impurity ions are implanted for channel dose into the whole surface layers of the active regions of the input/output transistor and first transistor to form p-channel dose regions 15. The channel dose region formed in the whole surface layer of the active region of the first transistor is different from the first and second embodiments. This process corresponds to the process illustrated in FIG. 2C. Next, processes similar to those illustrated in FIGS. 2D to 2F of the first embodiment are executed.

As illustrated in FIG. 5C, the core transistor is covered with a resist mask 23x, and n-type impurity ions, e.g., P ions, are implanted at an acceleration energy of 30 keV and a dose of $1E13 \text{ cm}^{-2}$ to form extension regions 24 on the source and drain sides of the input/output transistor and also extension regions 25 on the source and drain sides of the first transistor. This process corresponds to the process illustrated in FIG. 4B of the second embodiment. Thereafter, processes similar to those illustrated in FIGS. 2H to 2K are executed.

As illustrated in FIG. 5D, silicide regions 36 are formed on the silicon surfaces to complete the semiconductor integrated circuit device.

It is thus possible to form a transistor having the characteristics of good on-resistance and high breakdown voltage in the form capable of being integrated with an advanced CMOS transistor. By setting an impurity concentration outside the gate electrode on the drain side of the first transistor to a range of $2E17 \text{ cm}^{-3}$ to $5E18 \text{ cm}^{-3}$, it becomes possible to suppress generation of hot electrons and the initial degradation, and a high RF output can be realized.

The present invention has been described in connection with the embodiments. The present invention is not limited only to the embodiments. It is possible to make various alterations, substitutions, combinations, improvements and the like.

What are claimed are:

1. A semiconductor device comprising:
a semiconductor substrate;
an isolation region formed in said semiconductor substrate, the isolation region defining a first active region;
a first well of a first conductivity type formed in said first active region;
a first gate electrode formed above said first well, said first gate electrode including a first edge and a second edge which is located opposite to said first edge;
a first drain region formed from a location outside said first edge of said first gate electrode to a location under said first gate electrode and between said first edge and said second edge as viewed in plan in said first well, said first drain region having a first impurity concentration of a second conductivity type opposite to said first conductivity type;
a first channel region formed from a location outside said second edge of said first gate electrode to a location under said first gate electrode and between said first edge and said second edge as viewed in plan in said first well, forming an overlap region which overlaps a portion of said first drain region under said first gate electrode, said overlap region being located between said first edge and said second edge as viewed in plan in said first well, said first channel region having a second impurity concentration of said first conductivity type;
a source region of said second conductivity type formed outside said second edge of said first gate electrode as viewed in plan in said first well; and
a second drain region of said second conductivity type formed outside of said first edge of said first gate electrode and spaced apart from said first gate electrode as viewed in plan in said first well, said second drain region having a third impurity concentration higher than said first impurity concentration,
wherein a part of said first channel region located between said second edge of said first gate electrode and said overlap region has a fourth effective impurity concentration of the first conductivity type higher than a fifth effective impurity concentration of said overlap region, and a sixth effective impurity concentration of the second conductivity type of an intermediate region between said first edge of said first gate electrode and said second drain region, in said first drain region, is higher than the fifth effective impurity concentration of said overlap region.

2. The semiconductor device according to claim 1, further comprising an insulating film extending from above a drain-side region of said first gate electrode to above said intermediate region of said semiconductor substrate.

3. The semiconductor device according to claim 1, wherein said first channel region extends from said source region to a region under said first gate electrode, and is terminated without extending beyond said first edge of said first gate electrode, as viewed in plan.

4. The semiconductor device according to claim 1, wherein:
   said isolation region further defines a second active region and a third active region in said semiconductor substrate;
   the semiconductor device further comprises an input/output transistor formed in said second active region and a core transistor formed in said third active region; and
   said input/output transistor has a second channel region formed in a whole surface of said second active region and having a same depth and a same impurity concentration as the first channel region.

5. The semiconductor device according to claim 1, further comprising a drain extension region of said second conductivity type having a fourth impurity concentration and formed overlapping said intermediate region, wherein said fourth impurity concentration of said drain extension region is lower than said third impurity concentration of said second drain region.

6. The semiconductor device according to claim 5, wherein said first channel region is formed in a whole surface layer of said first well.

7. The semiconductor device according to claim 1, wherein said sixth effective impurity concentration of said intermediate region at a depth of 30 nm or shallower is in a range of $2 \times 10^{17}$ cm$^{-3}$ to $5 \times 10^{18}$ cm$^{-3}$.

8. The semiconductor device according to claim 7, wherein said semiconductor substrate is a silicon substrate, said first conductivity type is p-type, and said second conductivity type is n-type.

9. The semiconductor device according to claim 8, wherein said first impurity concentration is a concentration of phosphorous and said second impurity concentration is a concentration of boron.

10. A semiconductor device comprising:
    a semiconductor substrate;
    an isolation region formed in said semiconductor substrate, the isolation region defining first, second and third active regions;
    first, second and third wells of a first conductivity type formed in said first, second and third active regions, respectively;
    first, second and third gate electrodes formed above said first, second and third wells, respectively;
    an insulating film extending from above a drain-side region of said first gate electrode to outside of one edge of said first gate electrode, by a first distance;
    side wall spacers formed on both side walls of said second and third gate electrodes, and on a side wall of said first gate electrode opposite to said one edge;
    a first drain region formed from a location outside said one edge of said first gate electrode to a location under said first gate electrode as viewed in plan in said first well, said first drain region having a first impurity concentration of a second conductivity type opposite to said first conductivity type;
    a first channel region formed from a location outside another edge of said first gate electrode, opposite to said one edge, to a location under said first gate electrode as viewed in plan in said first well, forming an overlap region which overlaps with a portion of said first drain region under said first gate electrode, said first channel region having a second impurity concentration of said first conductivity type;
    a source region of said second conductivity type formed outside said another edge of said first gate electrode as viewed in plan in said first well; and
    a second drain region of said second conductivity type formed outside of said insulating film as viewed in plan in said first well, said second drain region having a third impurity concentration higher than said first impurity concentration,
    a second channel region of said first conductivity type formed in a whole surface layer of said second well, and having an impurity concentration equal to an impurity concentration of said first channel region;
    a third channel region of said first conductivity type formed in a whole surface layer of said third well, and having an impurity concentration higher than the impurity concentration of said second channel region; and
    source/drain regions of said second conductivity type formed in said second and third wells, outside said second and third gate electrodes as viewed in plan,
    wherein a second conductivity type effective impurity concentration of an intermediate region between said one edge of said first gate electrode and said second drain region, in said first drain region, is higher than a second conductivity type effective impurity concentration of said overlap region, and said second conductivity type effective impurity concentration of said intermediate region at a depth of 30 nm or shallower is in a range of $2 \times 10^{17}$ cm$^{-3}$ to $5 \times 10^{18}$ cm$^{-3}$.

11. The semiconductor device according to claim 1, wherein said overlap region includes a third edge and a fourth edge under the first gate electrode; said fourth edge is nearer from said source region than said third edge; said fourth edge is located between said second edge and said third edge as viewed in plan; and said third edge is located between said first edge and said fourth edge as viewed in plan.

12. The semiconductor device according to claim 10, wherein said first channel region extends from said source region to a region under said first gate electrode, and is terminated without extending beyond said one edge of said first gate electrode, as viewed in plan.

13. The semiconductor device according to claim 12, wherein a terminating end of said first channel region is retracted from said one edge of said first gate electrode, as viewed in plan.

14. The semiconductor device according to claim 10, further comprising a drain extension region of said second conductivity type having a fourth impurity concentration and formed overlapping said intermediate region, wherein said fourth impurity concentration of said drain extension region is lower than said third impurity concentration of said second drain region.

15. The semiconductor device according to claim 14, wherein said first channel region is formed in a whole surface layer of said first well.

* * * * *